United States Patent [19]
Lee et al.

[11] Patent Number: 5,240,796
[45] Date of Patent: * Aug. 31, 1993

[54] METHOD OF FABRICATING A CHROMELESS PHASE SHIFT RETICLE

[75] Inventors: Ruojia Lee; J. Brett Rolfson, both of Boise, Id.

[73] Assignee: Micron Technology, Inc., Boise, Id.

[*] Notice: The portion of the term of this patent subsequent to Mar. 16, 2010 has been disclaimed.

[21] Appl. No.: 727,834

[22] Filed: Jul. 9, 1991

[51] Int. Cl.$^5$ .............................................. G03F 9/00
[52] U.S. Cl. ...................................... 430/5; 430/269; 430/313; 430/321
[58] Field of Search .................... 430/5, 22, 269, 313, 430/321

[56] References Cited

U.S. PATENT DOCUMENTS

| 3,604,778 | 9/1971 | Burckhardt | 350/3.5 |
| 4,360,586 | 11/1982 | Flanders et al. | 430/321 |
| 4,755,415 | 7/1988 | Iijima et al. | 428/163 |
| 4,902,899 | 2/1990 | Lin et al. | 250/492.1 |

OTHER PUBLICATIONS

Durnin, et al., "Diffraction-Free Beams" Physical Review Letters, vol. 58 (Apr. 13, 1987), p. 1499.
Yamanaka, et al., "A 5.9 μm² Super Low Power SRAM Cell Using a New Phase-Shift Lithography" IEDM 90 (Apr., 1990), p. 477.
Watanabe, et al., "Transparent Phase Shifting Mask", IEDM 90 (Apr., 1990), p. 821.
Terasawa, et al., "0.3-micron optical lithograhy using a phase-shifting mask", SPIE vol. 1088 Optical/Laser Microlithography II (1989), p. 25.
Nitayama, et al., "New Phase Shifting Mask with Self-aligned Phase Shifters for a Quarter Micron Photolithograph", IEDM 89 (Jul., 1989), p. 57.
Levenson, et al., "The Phase-Shifting Mask II: Imaging Simulations and Submicrometer Resist Exposures", IEEE Transactions on Electron Devices, vol. ED-31, No. 6 (Jun., 1984), p. 753.
Lin, Burn J., "Phase Shifting and Other Challenges in Optical Mask Technology", IBM-EF-15 (Sep. 26, 1990).
Hanyu, et al., "New phase-shifting mask with highly transparent SiO₂ phase shifters", SPIE vol. 1264 Optical/Laser Microlithography III (1990), p. 167.
Pfau, et al., "Exploration of fabrication techniques for phase shifting marks", Semiconductor Research Corporation (Sep. 11, 1990).
Neureuther, Andrew R., "Modeling Phase Shifting Masks", BASCUS Symposium (Sep. 26, 1990).
Fukuda, et al., "Phase-Shifting Mask and FLEX method for Advanced Photolithography", SPIE vol. 1264 Optical/Laser Microlithography III (1990), p. 14.
"LSI Process Lithography, Reticle, Stepper, DRAM", Nikkei Microdevice (Jul. 1990).
"64 M", Nikkei Microdevice (Jul., 1990).

(List continued on next page.)

Primary Examiner—Marion E. McCamish
Assistant Examiner—S. Rosasco
Attorney, Agent, or Firm—Stephen A. Gratton

[57] ABSTRACT

A method of fabricating a chromeless phase shift reticle. The method includes the steps of: depositing a layer of material on a transparent substrate to a thickness of "t"; patterning and anisotropically etching the material to form a pattern of openings to the substrate; depositing a phase shifter material over the layer of material and into the openings; polishing by chemical mechanical planarization (CMP) the phase shifter material; and selectively wet etching the initially deposited layer of material. This process forms a chromeless phase shift reticle having a pattern of phase shifters of a thickness of "t" with a pattern of light transmissive areas on the substrate therebetween. The thickness "t" and a phase shifter material index of refraction may be selected to achieve a 180° phase shift between light transmitted through a phase shifter relative to light transmitted through a light transmissive area on the substrate.

19 Claims, 3 Drawing Sheets

OTHER PUBLICATIONS

Ku, et al., "Use of a $\pi$-Phase-Shifting X-Ray mask to Increase the Intensity Slope at Feature Edges", Semiconductor Research Corporation (Jun. 23, 1987).

Nakagawa, et al., "Fabrication of 64M DRAM with i-Line Phase-Shift Lithography", IEDM 90 (Apr., 1990), p. 817.

Levenson, Marc D., "What IS a Phase-Shifting Mask?", IBM Research Report (Aug. 15, 1990).

Prouty, et al., "Optical Imaging with Phase Shift Masks", Technology Transfer #90080327A-MIN, p 41.

"Second Phase Shift Mask Workshop", Japanese Patent Applications, SEMA-TECH, Technology Transfer #90100345A-MIN, p. 159.

Levenson, et al., "Improving Resolution in Photolithography with a Phase-Shifting Mask", IEEE Transactions on Electron Devices, vol. ED-29, No. 12 (Dec., 1982), p. 1828.

Terasawa, et al., "Improved resolution of an i-line stepper using a phase-shifting mask", J. Vac. Sci. Technol. B., vol. 8, No. 6 (Nov./Dec., 1990), p. 1300.

Jinbo, et al., "0.2 $\mu$m or Less i-Line lithography by Phase-Shifting-Mask Technology", IEDM 90 (Apr., 1990), p. 825.

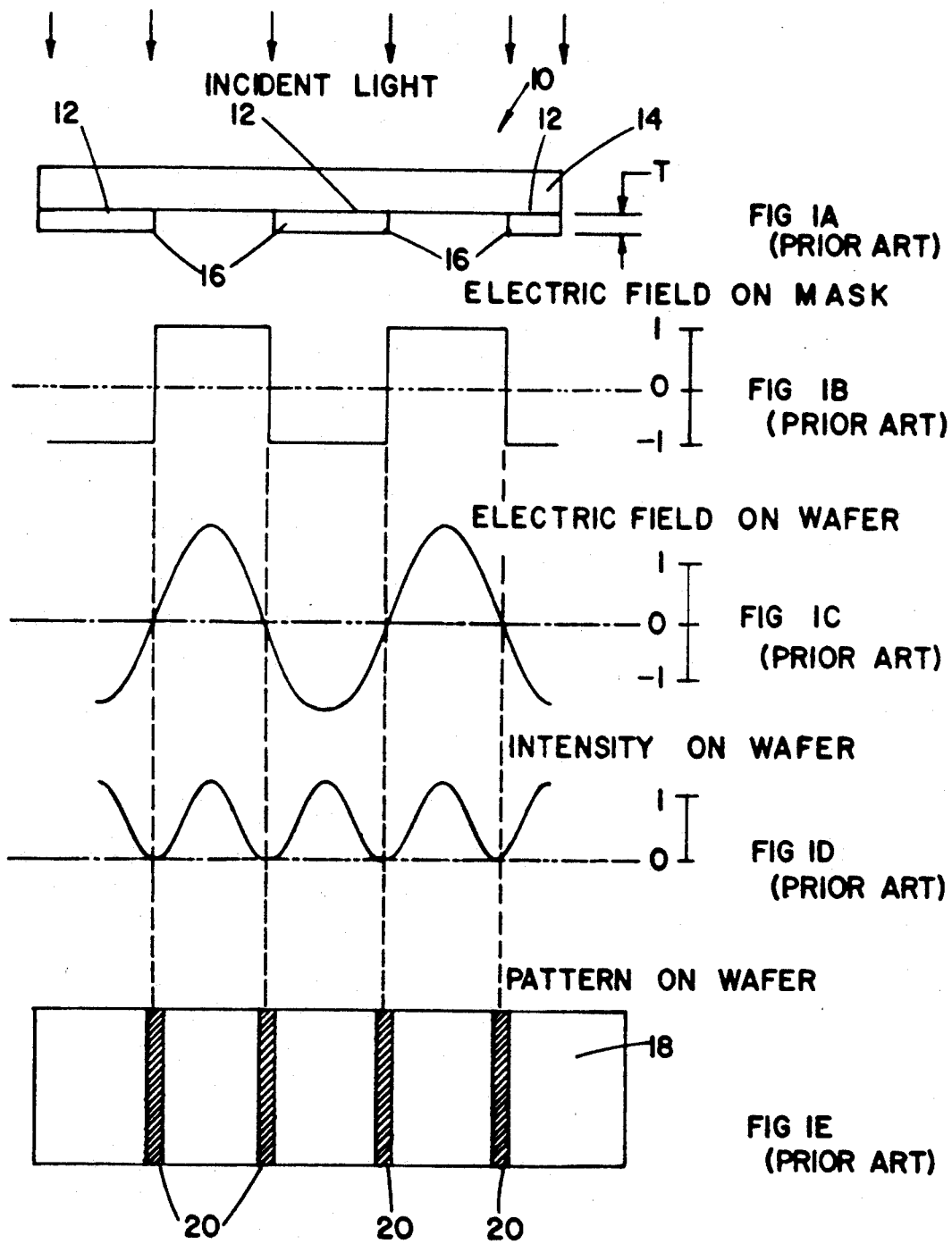

METHOD OF FABRICATING A CHROMELESS PHASE SHIFT RETICLE

FIELD OF THE INVENTION

This invention relates to semiconductor manufacture and more particularly to a novel process particularly suited to fabricating a chromeless phase shift reticle or mask having high quality optical surfaces that can be used in fine-line photolithography.

BACKGROUND OF THE INVENTION

As semiconductor manufacturing advances to ultra-large scale integration (ULSI), the devices on semiconductor wafers shrink to sub-micron dimension and the circuit density increases to several million transistors per die. In order to accomplish this high device packing density, smaller and smaller feature sizes are required. This may include the width and spacing of interconnecting lines and the surface geometry such as corners and edges, of various features.

The requirement of small feature sizes with close spacing between adjacent features requires high resolution photolithographic processes. In general, photolithography utilizes a beam of light, such as U.V. waves, to transfer a pattern from a photolithographic reticle or mask onto a photoresist coating through an imaging lens. (As used herein, the term "reticle" and "mask" are interchangeable.) The mask includes opaque and transparent regions such that the shapes match those of the openings in the resist coating in the desired or predetermined pattern.

One technique currently being investigated for improving the resolution of the photolithographic process is known as phase shift lithography. With phase shift lithography the interference of light rays is used to overcome diffraction and improve the resolution and depth of optical images projected onto a target. In phase shift lithography, the phase of an exposure light at the object is controlled such that adjacent bright areas are formed preferably 180° out of phase with one another. Dark regions are thus produced between the bright areas by destructive interference even when diffraction would otherwise cause these areas to be lit. This technique improves total resolution at the object and allows resolutions as fine as 0.15 μm to occur.

An early patent in this field, U.S. Pat. No. 4,360,586 to Flanders et. al., was issued on Nov. 23, 1982 and assigned to MIT. This patent was directed to exposing periodic optical features on an object surface. The features were characterized by a spatial period p. According to the invention, a source of radiant energy of wavelength λ illuminates a surface to be exposed through a mask having a spatial period separated from the surface by a distance approximately $S_n = p^2/n\lambda$, where n is an integer greater than one.

With respect to semiconductor fabrication numerous laboratory techniques have been proposed to employ phase shifting in the photopatterning of semiconductor wafers. Most of the work in this area has centered around either "Alternating Phase Shifting", "Subresolution Phase Shifting", or "Rim Phase Shifting" experiments. In general, in each of these techniques a phase shift mask or reticle is constructed in repetitive patterns of three distinct layers of material. An opaque layer on the mask provides areas that allow no light transmission therethrough, a transparent layer provides areas which allow close to 100% of light to pass through, and a phase shifter layer provides areas which allow close to 100% of light to pass through but phase shifted 180° from the light passing through the transparent areas. The transparent areas and phase shifting areas are situated such that light rays diffracted through each area are canceled out in a darkened area therebetween. This creates the pattern of dark and bright areas which can be used to clearly delineate features of a pattern on a photopatterned wafer.

"Alternating Phase Shifting" as disclosed in [1] is a spatial frequency reduction concept similar to the method disclosed in the Flanders et. al. patent. It is characterized by a pattern of features alternately covered by a phase shifting layer. "Subresolution Phase Shifting" [2] promotes edge intensity cut off by placing a subresolution feature adjacent to a primary image and covering it with a phase shifting layer. "Rim Phase Shifting" [3] overhangs a phase shifter over a Chrome mask pattern.

Another type of phase shift mask or reticle is known in the art as a chromeless phase shift mask. A chromeless phase shift mask is shown in FIG. 1A. With a chromeless phase shift mask 10, phase shifters 12 are formed on a transparent substrate 14 in a desired repetitive pattern. Each phase shifter 12 is formed of a transparent material, such as silicon dioxide ($SiO_2$). The phase shifters 12 are formed with a thickness "t" that is selected to achieve a 180° (λ) phase shift for light passed through a phase shifter 12 in relation to light passed through the transparent substrate 14. This optimal thickness "t" can be determined by the formula:

$$t = \frac{i\lambda}{2(n-1)}$$

where
  t = thickness of phase shift material
  i = an odd integer
  λ = wavelength of exposure light
  n = refractive index of phase shift material at the exposure wavelength Both the thickness "t" and refractive index "n" of the phase shifter material are selected to achieve an optimum 180° phase shift.

As shown in FIG. 1B, the electric field on the mask 10 is stepped 180° (π) out of phase by each phase shifter 12. As shown in FIG. 1C, the electric field on the wafer has a sinusoidal distribution, varying in amplitude from 1 to −1, As shown in FIG. 1D, the intensity at the wafer also has a sinusoidal distribution with a pattern of zero intensities aligned with the edges 16 of the phase shifters 12. This intensity distribution at the wafer is caused by the phase canceling of light passed through the transparent substrate 14 versus light passed through the phase shifters 16. The maximum phase canceling occurs at the edges 16 of the phase shifters 12 which correspond to areas of zero intensity at the wafer.

A pattern at the wafer 18 is shown in FIG. 1E. A pattern of darkened areas 20 formed on the wafer corresponds to maximum destructive phase canceling occurring at the edges 16 of the phase shifters.

A prior art process for forming a chromeless phase shift mask is shown in FIGS. 2A-2D. As an initial step (2A), a Quartz substrate 22 has a layer of an opaque material, such as Chrome, 24 deposited thereon. A photosensitive layer of resist 26 is next deposited upon the Chrome layer 24. The resist 26 is then patterned, and the Chrome layer is etched to form the patterned Chrome layer 28 on the substrate 22 as shown in FIG. 2B. Next, as shown in FIG. 2C, the areas 30 of the Quartz substrate 22 corresponding to openings formed in the patterned Chrome layer 28 are etched to a depth of "t". The patterned Chrome layer 28 is then stripped off of the substrate 22 to form the finished phase shift mask 32 or reticle. The phase shift mask 32 is characterized by a pattern of phase shifters 34 which are thicker than light transmissive areas 36 on the substrate 22 by a distance of "t". The distance "t" along with the index of refraction of the substrate 22 are selected to achieve a 180° phase shift.

A problem with this prior art technique for forming a chromeless phase shift reticle 32 is that the light transmissive areas 36 of the phase shift mask 32 between the phase shifters 34 are roughened by the etching step (FIG. 2C) required to etch the substrate 22 to a depth of "t". In general, the phase shifters 34 must be formed with parallel and vertical (i.e., vertical to the substrate) sidewalls. This requires an anisotropic dry etch. Such an anisotropic dry etch is typically accomplished with a plasma planar system. In such a dry etching system, wafers are placed on a planar surface under an RF electrode in a plasma field. Etching ions, such as those of chlorine or fluorine, are then directed over the exposed areas of the wafer surface to be etched. Such a dry etching process forms a roughened and optically irregular substrate surface in the light transmissive areas 36 of the substrate 22 which are attacked by the etchant. The effectiveness of the finished phase shift mask 32 may be affected by the roughened surface of these light transmissive areas 36. As an example, these roughened light transmissive areas 36 may not be totally transparent and may reflect a portion of the incident light. Additionally, an index of refraction of a roughened surface may be different than an index of refraction of a smooth surface.

The present invention is directed to a process for forming a phase shift mask in which all surfaces of the mask are polished and more optically perfect.

SUMMARY OF THE INVENTION

In accordance with the present invention, a method for fabricating a chromeless phase shift reticle is provided. The method of the invention, in general, includes the steps of:

depositing a layer of material onto a transparent substrate to a thickness of "t";

patterning the layer of material with a pattern of openings to the substrate;

depositing a phase shifter material over the layer of material and into the openings;

polishing the phase shifter material to an endpoint of the layer of material; and removing by selectively wet etching the patterned layer of material from the substrate to form a pattern of phase shifters having light transmissive areas therebetween.

In an illustrative embodiment of the invention, the layer of material initially deposited is preferably an electrically conductive material, such as Chrome, Chromium, or Aluminum. This electrically conductive material is deposited to a thickness of "t" (or slightly greater than "t") onto a transparent substrate such as Quartz. Such an electrically conductive or metallic layer of material is preferred because it can later be easily removed by a selective wet etch without roughening the surface of the substrate (i.e., light transmissive areas). After deposition, the electrically conductive layer is then coated with a maskable material, such as photoresist, which is patterned by a technique, such as electron beam lithography, and anisotropically etched to form the pattern of openings through the electrically conductive layer to the Quartz substrate. A phase shifter material, such as silicon dioxide, is then deposited, such as by chemical vapor deposition (CVD), over the electrically conductive layer and into the openings. This phase shifter material is then polished using a technique, such as chemical mechanical planarization (CMP) to an endpoint of the electrically conductive layer, which is preferably formed to a thickness of "t". Alternately, if the electrically conductive material is initially deposited to a thickness of greater than "t", some of this material may be removed along with some of the phase shifter material to establish a thickness of "t". After CMP, the patterned electrically conductive layer is removed, using a highly selective etchant, leaving the phase shifter material to form a pattern of phase shifters on the Quartz substrate with a thickness of "t" and with light transmissive openings therebetween.

With the method of the invention, the surfaces of the phase shifters are polished by the (CMP) process. The polished surfaces are almost optically flawless to allow an efficient transmission of light therethrough. Moreover, a wet etchant for selectively removing the electrically conductive layer can be selected to not affect or roughen the surface of the Quartz substrate and, in particular, the light transmissive areas.

Other objects, advantages, and capabilities of the present invention will become more apparent as the description proceeds.

BRIEF DESCRIPTION OF THE DRAWINGS

FIG. 1A is a diagrammatic representation of a prior art chromeless phase shift mask;

FIGS. 1B-1D are graphs illustrating the operational characteristics of the prior art phase shift mask;

FIG. 1E is a schematic diagram of the pattern formed on a wafer by the prior art chromeless phase shift mask;

DETAILED DESCRIPTION OF THE INVENTION

Figure 2A:
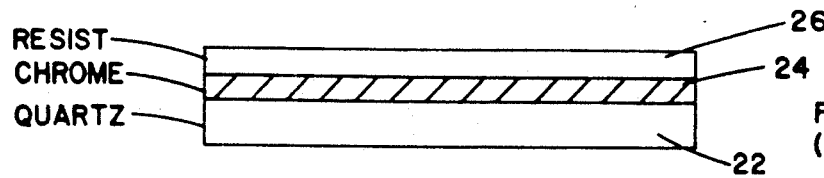
FIGS. 2A-2D are diagrammatic representations showing the steps involved in fabricating a prior art phase shift mask.
Figure 2B:
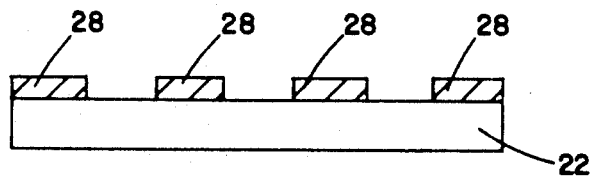
Figure 2C:
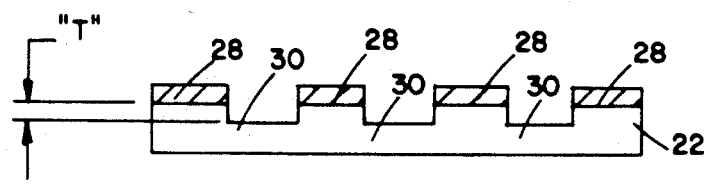
Figure 2D:
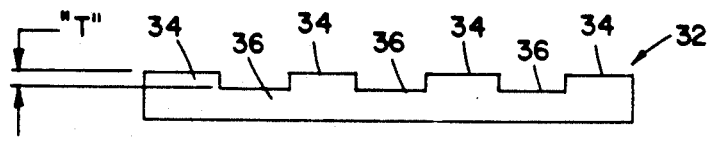
Figure 3A:
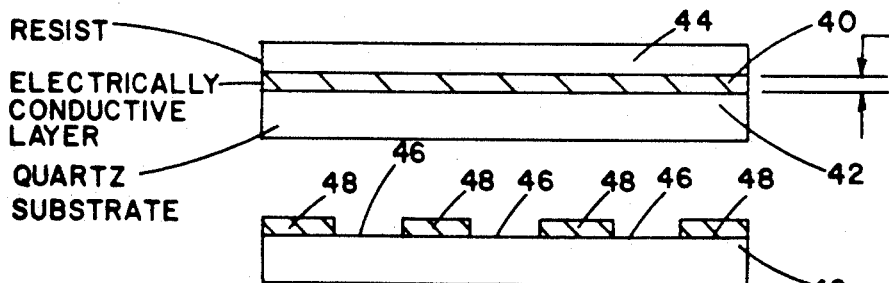
FIGS. 3A-3E are diagrammatic representations showing the steps involved in fabricating a chromeless phase shift mask or reticle in accordance with the invention.
Figure 3B:

Referring now to FIGS. 3A-3E, a method of fabricating a chromeless phase shift reticle in accordance with the invention is shown. As shown in FIG. 3A, in the initial step, a layer of material, which is preferably an electrically conductive or metallic layer 40, such as Aluminum, Chrome, or Chromium, is deposited upon a transparent substrate. In an illustrative embodiment of the invention, the transparent substrate 30 is formed of a polished Quartz (QZ) blank. Quartz is a highly purified glass favored for its optical properties, inherent stability at high temperatures, and its cleanliness. Quartz is typically utilized as the mask substrate material in optical projection systems and is highly transparent in the UV region. Alternately, the substrate 42 may be formed of any other transparent material having suitable optical and mechanical properties. Both surfaces of the Quartz substrate 42 may be initially polished to achieve an almost optically perfect light transmissive medium.

The electrically conductive or metallic layer 44 is deposited or otherwise formed upon the Quartz substrate 42 to a thickness of "t". This may be accomplished by conventional processes, such as sputtering, chemical vapor deposition (CVD), or electron beam deposition (EBD). In the illustrative embodiment, the electrically conductive layer 40 is Aluminum, Chrome, or Chromium, which are typically utilized in such applications. These electrically conductive or metallic materials are characterized by mechanical properties suitable for plating, patterning, and etching. Moreover, electrically conductive or metallic materials can later be selectively removed relative to the Quartz substrate 42 using a wet etchant. Alternately, other deposited films, such as polysilicon, which can be patterned and etched and then selectively removed with a subsequent wet etch without affecting the substrate would also be suitable for this application. In general, however, an electrically conductive material is preferred with existing fabrication technology because it can be easily patterned with an E-beam mask writer and later selectively removed with respect to the Quartz substrate 42. Additionally, an electrically conductive or metallic material functions effectively as a stop in a subsequent CMP step.

After deposition of the electrically conductive layer 40 to a thickness of "t", a layer of photoresist 44 is coated onto the electrically conductive layer 40 and patterned by techniques known in the art, such as with E-beam writing or laser pattern writing. An etching step (FIG. 3B) may then be used to form a patterned electrically conductive layer 48 with openings 46 through the patterned layer to the substrate 42. The etching step is preferably an anisotropic dry etch as previously described, such that the patterned layer 48 has a pattern of openings 46 with generally parallel vertical sidewalls of the electrically conductive material formed on either side of the openings 46, which will subsequently define light transmissive areas on the substrate 22. After anisotropic etching of the electrically conductive layer 40, 15 the photoresist 44 is stripped.

Figure 3C:
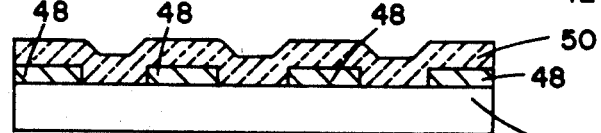

Next, and as shown in FIG. 3C, a phase shifter material 50 is blanket deposited over the patterned electrically conductive layer 48 and into the openings 46. The phase shifter material 50 may be deposited by any conventional process, such as evaporation or chemical vapor deposition (CVD). The phase shifter material 50 may be any transparent material that has an index of refraction with light that is different than the index of refraction for light with air. It is also preferable to utilize an inorganic material that is transparent in the UV and deep UV regions where most photolithographic processes are performed. This may, for example, be at a wavelength of about 248 nm for KrF excimer laser lithography. Photolithography may also be performed in the range of the UV i-line (365 nm) or the UV g-line (436 nm) which are also common wavelengths used in photolithographic processes.

A suitable phase shifter material 50 is silicon dioxide ($SiO_2$) which is commonly used as the mask substrate in semiconductor optical projection systems. Another suitable phase shifter material is Silicon Nitride (SiN,). The phase shifter material may be conformally deposited to a thickness sufficient to fill the openings 46 and blanket the patterned electrically conductive layer 48.

Figure 3D:
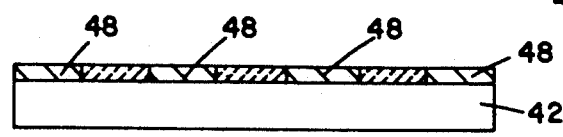

Next, and as shown in FIG. 3D, the phase shifter material 50 may be polished to the planar endpoint of the patterned electrically conductive layer 48. A preferred method of polishing the patterned electrically conductive layer 48 is by chemical mechanical planarization (CMP). In general, the chemical mechanical planarization process involves holding or rotating a thin, flat wafer of semiconductor material against a wetted polishing surface under controlled pressure, temperature, and chemical conditions. A polishing slurry, such as a solution of alumina or silica, is utilized as the abrasive medium. A rotating polishing head is typically utilized to hold the wafer under controlled pressure against a rotating polishing platen. The polishing platen may be covered with a relatively soft, wetted material, such as blown polyurethane.

Such apparatus for polishing thin, flat, semiconductor water are well known in the art. U.S. Pat. Nos. 4,193,226, and 4,811,522 to Gill, Jr. and U.S. Pat. No. 3,841,031 to Walsh, for instance, disclose such apparatus.

Figure 3E:
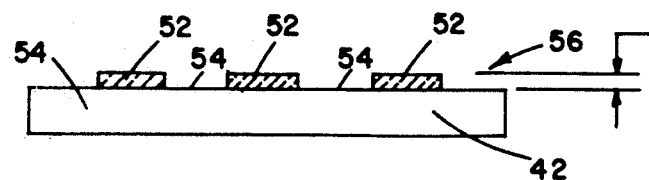

Next, and as shown in FIG. 3E, the patterned electrically conductive layer 48 is etched away to form a pattern of phase shifters 52 having vertical parallel sidewalls with a pattern of light transmissive areas 54 therebetween formed on the surface of the Quartz substrate 42. This etching step may be accomplished with a wet etchant selected to remove the patterned electrically conductive layer 48 but leave the light transmissive areas 54 of the Quartz substrate 42 as unaffected. Suitable selective wet etchants for an electrically conductive or metallic material, such as Aluminum, include a mixture of Sulfuric Acid and Hydrogen Peroxide. A hot Phosphoric Acid will also strip Aluminum but have a negligible affect on Quartz. For stripping Chrome or Chromium, there are commercially available etchants sold under the registered trademarks Cyantek ® CR-3, CR-7, and CR-14. In general, these etchants comprise mixtures of an acid, Cerric Ammonium Nitrate and water. The most common acids are Acetic, Perchloric, and Nitric. If polysilicon is used as the patterned layer, a mixture of Nitric, Hydrofluoric, and Acetic Acid and water can be used as the selective etch. This formulation will have some affect on the Quartz substrate, but would still be much better than the attack of the substrate by a dry plasma etch. This technique avoids the prior art problem of an anisotropic dry (or plasma) etch roughening the surface of the substrate, to produce less-than-optically-perfect light transmissive areas. As is known in the art, a selective wet etch will not have the same effect on the surface of the Quartz substrate 42 as a dry etch as previously described. Moreover, if the Quartz substrate 42 is polished prior to fabrication of the reticle, the light transmissive areas 54 formed between the phase shifters 52 are almost optically perfect. Additionally, the surface of the phase shifters 5 has been polished smooth by the previous (CMP) step to provide a more optically perfect surface for the phase shifters 52.

The phase shifters 52 formed on the substrate 42 have a thickness of "t" that is determined by the initial deposition of the electrically conductive or metallic layer 40 (FIG. 3A). This thickness of "t" along with an index of refraction dependent on the phase shifter material are selected to provide a 180° phase shift in accordance with the previously disclosed formula:

$$t = \frac{i\lambda}{2(n-1)}.$$

One suitable thickness "t" using a silicon dioxide (SiO$_2$) phase shifter material is 3800 Å.

Figure 4:
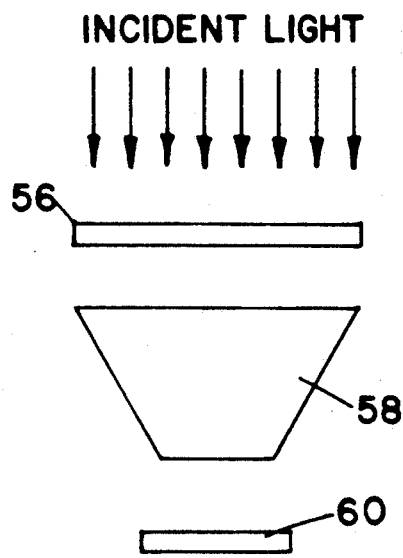
FIG. 4 is a diagrammatic representation of a chromeless phase shift mask or reticle fabricated in accordance with the invention in use during phase shift photolithography of a semiconductor wafer.

The phase shift reticle 56 formed by the process of the invention has the same light transmission characteristics as shown in FIGS. 1B-1E for the prior art phase shift reticle 10 previously described. With reference to FIG. 4, in use, the phase shift reticle 56 is situated between the incoming incident light (i.e., KrF laser) and a wafer 60 to be processed. A reduction lens 58 is located between the phase shift reticle 56 and wafer 60. The reduction lens 58 may be selected as required for a particular application, i.e., 1x, 4x, 5x and 10x.

In the illustration of FIG. 4, a step and repeat system is utilized. In this system, the wafer 60 is stepped under the lens 58 to expose the pattern of the reticle 56 in sections over the entire surface of the wafer 60. This is typical application for a phase shifting reticle 56 formed in accordance with the invention, although applications may also be possible including photopatterning of items other than semiconductor wafers.

Figure 5:
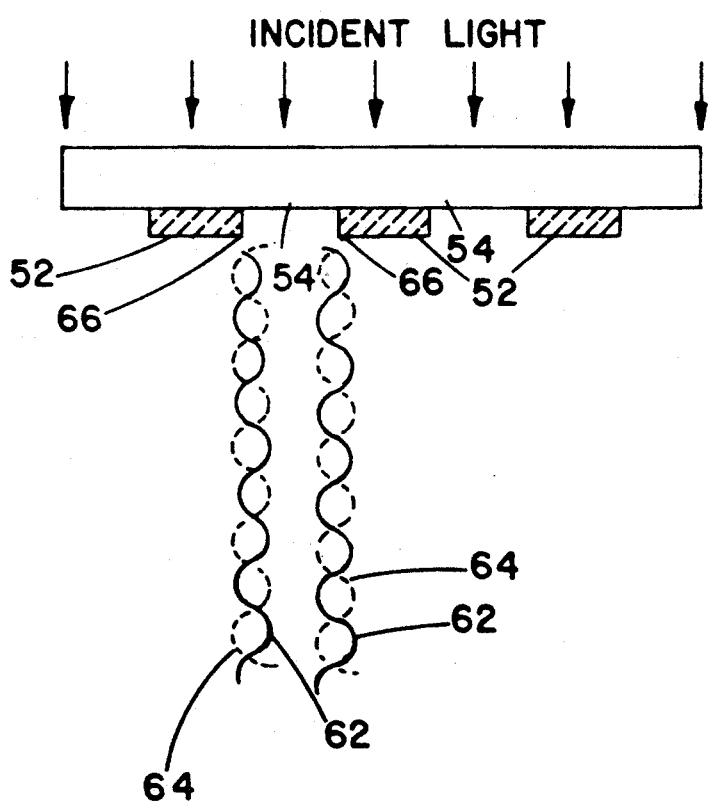
FIG. 5 is a diagrammatic representation of a phase shift mask or reticle fabricated in accordance with the invention showing the phase shifting of light rays passed through the phase shift reticle.

With reference to FIG. 5, the maximum canceling effect between light transmitted through a phase shifter 52 or through a light transmissive area 54 of the substrate occurs at the edges 66 of the phase shifters 52. At the edge 66 of a phase shifter 52, a light wave 62 transmitted through a light transmissive area 54 is exactly 180° out of phase with a light wave 64 transmitted through the phase shifter 52. The light waves 62 and 64 thus cancel each other out. This can be used to produce a pattern on a wafer 60 as shown in FIG. 1E.

Thus, the invention provides a simple yet unobvious method of fabricating phase shift reticles adapted for us in semiconductor photolithographic processes. Moreover, the method of the invention permits the formation of more optically perfect phase shifters and light transmissive areas on a substrate. While the method of the invention has been described with reference to a preferred embodiment thereof, as will be apparent to those skilled in the art, certain changes and modifications can be made without departing from the scope of the invention as defined by the following claims.

What is claimed is:

1. A method of fabricating a chromeless phase shift reticle comprising:
   forming a layer of material on a transparent substrate to a predetermined thickness;
   patterning the layer of material to form a pattern of openings to the substrate;
   depositing a phase shifter material over the layer of material and into the openings;
   polishing and planarizing the phase shifter material to a thickness of "t" to provide a substantially optically flawless surface for producing a phase shift of light during photopatterning; and
   removing the patterned layer of material from the substrate to form a pattern of phase shifter having a thickness of "t" on the substrate with a pattern of light transmissive areas on the substrates between the phase shifters.

2. The method as recited in claim 1 and wherein:
   the thickness "t" of the layer of material and an index of refraction determined by the phase shifter material are selected to produce phase shifters which produce a phase shift of light passed through the phase shifters relative to light passed through a light transmissive area of approximately 180°.

3. The method as recited in claim 2 and wherein:
   the layer of material is an electrically conductive material.

4. The method as recited in claim 3 and wherein:
   the electrically conductive material is written and anisotropically dry etched to form the openings by a photolithographic process including an anisotropic etch.

5. The method as recited in claim 4 and wherein:
   the electrically conductive material is removed from the substrate by a selective etch.

6. The method as recited in claim 5 and wherein:
   the substrate is formed of Quartz and is polished on both sides prior to fabrication of the phase shifting reticle.

7. The method as recited in claim 6 and wherein:
   the phase shifter material is silicon dioxide (SiO$_2$).

8. The method as recited in claim 7 and wherein:
   the electrically conductive material is Aluminum.

9. The method as recited in claim 7 and wherein:
   the electrically conductive material is Chrome.

10. The method as recited in claim 7 and wherein:
    the phase shifter material is conformally deposited with a blanket chemical vapor deposition (CVD).

11. The method as recited in claim 7 and wherein:
    the phase shifter material is polished by chemical mechanical planarization (CMP).

12. A method of fabricating a chromeless phase shift reticle for use in semiconductor photolithography comprising:
    depositing an electrically conductive layer of material on a transparent substrate to a thickness of "t";
    patterning and anisotropically etching the electrically conductive layer to form a pattern of openings to the substrate using a photolithography/dry etching process with the openings having generally vertical sidewalls;
    conformally depositing a phase shifter material over the electrically conductive layer and into the openings;
    chemically mechanically planarizing (CMP) the phase shifter material to polish and planarize the phase shifter material to an endpoint of the electrically conductive layer to provide a substantially optionally flawless surface for producing a phase shift of light during photopatterning;
    selectively etching the electrically conductive layer to remove the electrically conductive layer using a selective etch such that phase shifters are formed on the substrate in a pattern with light transmissive openings therebetween with the thickness "t" and index of refraction of the phase shifters selected to provide a 1802 phase shift for light passed through a phase shifter relative to light passed through a light transmissive area.

13. A method of forming a chromeless phase shift reticle as recited in claim 12 and further comprising:
    polishing the substrate on both sides during initial formation of a substrate blank.

14. The method of forming a chromeless phase shift reticle as recited in claim 13 and wherein:

the substrate is Quartz, and the phase shifter material is silicon dioxide (SiO$_2$).

15. The method of forming a chromeless phase shift reticle as recited in claim 14 wherein:

the electrically conductive material is aluminum.

16. The method of forming a chromeless phase shift reticle as recited in claim 15 and wherein:

selective etching is with a mixture of sulfuric Acid and Hydrogen Peroxide.

17. The method of forming a chromeless phase shift reticle as recited in claim 15 and wherein:

selective etching is with hot Phosphoric Acid.

18. The method of forming a chromeless phase shift reticle as recited in claim 14 and wherein:

the electrically conductive material is Chrome.

19. The method of forming a chromeless phase shift reticle as recited in claim 18 and wherein:

selective etching is with a mixture of an acid, Cerric Ammonium Nitrate, and water.

* * * * *

UNITED STATES PATENT AND TRADEMARK OFFICE
CERTIFICATE OF CORRECTION

PATENT NO. : 5,240,796

DATED : August 31, 1993

INVENTOR(S) : Ruojia Lee
J. Brett Rolfson

It is certified that error appears in the above-identified patent and that said Letters Patent is hereby corrected as shown below:

Column 6, line 25, change "water" to -- wafers--.

Column 7, line 67, change "substrates" to --substrate--.

Column 8, line 60, change "1802" to --180°--.

Signed and Sealed this

Ninth Day of May, 1995

*Attest:*

BRUCE LEHMAN

*Attesting Officer*         *Commissioner of Patents and Trademarks*